(12) United States Patent
Ito (10) Patent No.: US 8,976,537 B2
(45) Date of Patent: Mar. 10, 2015

(54) SEMICONDUCTOR DEVICE

(75) Inventor: Takeshi Ito, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 285 days.

(21) Appl. No.: 13/487,775

(22) Filed: Jun. 4, 2012

(65) Prior Publication Data

US 2013/0063921 A1    Mar. 14, 2013

(30) Foreign Application Priority Data

Sep. 14, 2011  (JP) ................................. 2011-200526

(51) Int. Cl.
*H05K 5/00* (2006.01)
*H05K 3/30* (2006.01)
*H05K 7/12* (2006.01)
*H05K 3/32* (2006.01)

(52) U.S. Cl.
CPC .................. *H05K 3/303* (2013.01); *H05K 7/12* (2013.01); *H05K 3/325* (2013.01); *H05K 2201/0311* (2013.01); *H05K 2201/10295* (2013.01); *H05K 2201/1031* (2013.01); *H05K 2201/10409* (2013.01)
USPC ..................... 361/758; 174/138 E; 174/138 G (58) Field of Classification Search
USPC ...... 361/758, 760, 807, 809, 810; 174/138 E, 174/138 G
See application file for complete search history.

(56) References Cited

U.S. PATENT DOCUMENTS

| | | | |
|---|---|---|---|
| 4,498,120 A * | 2/1985 | Kaufman | 361/720 |
| 4,872,102 A * | 10/1989 | Getter | 363/141 |
| 6,084,178 A * | 7/2000 | Cromwell | 174/383 |
| 6,252,776 B1 * | 6/2001 | Saito et al. | 361/719 |
| 6,356,448 B1 * | 3/2002 | DiBene et al. | 361/721 |
| 6,404,632 B1 * | 6/2002 | Forkas | 361/703 |
| 6,535,386 B2 * | 3/2003 | Sathe et al. | 361/700 |
| 7,493,690 B2 * | 2/2009 | Muto et al. | 29/840 |
| 7,898,806 B2 * | 3/2011 | Isomoto | 361/697 |
| 8,415,569 B2 * | 4/2013 | Chan et al. | 174/544 |
| 2014/0014644 A1 * | 1/2014 | Akiba et al. | 219/444.1 |

FOREIGN PATENT DOCUMENTS

| | | |
|---|---|---|
| JP | 64-13195 U | 1/1989 |
| JP | 5-71513 A | 3/1993 |
| JP | 9-23397 A | 1/1997 |
| JP | 2001-251029 A | 9/2001 |
| JP | 2002-203931 | 7/2002 |
| JP | 2004-28239 A | 1/2004 |
| JP | 2004-281743 | 10/2004 |

OTHER PUBLICATIONS

Japanese Office Action issued on Jul. 22, 2014, in Patent Application No. 2011-200526 with English translation.

* cited by examiner

*Primary Examiner* — Hung S Bui
(74) *Attorney, Agent, or Firm* — Oblon, Spivak, McClelland, Maier & Neustadt, L.L.P.

(57) ABSTRACT

A spring washer sandwiched between flat washers is interposed between a land on one surface of a printed circuit board of a control board part and an attachment plate, and a screw is inserted from the other surface of the printed circuit board through a substrate through hole extending through the printed circuit board, one of the flat washers, the spring washer, and the other flat washer and is screwed into a screw hole formed in the attachment plate, thereby fixing the attachment plate to the printed circuit board.

11 Claims, 13 Drawing Sheets

SEMICONDUCTOR DEVICE

BACKGROUND OF THE INVENTION

1. Field of the Invention

The present invention relates to a semiconductor device, and more particularly to a semiconductor device including a semiconductor element.

2. Description of the Background Art

One of semiconductor elements is a thyristor, for example. The thyristor is attached to a predetermined circuit pattern formed on a printed circuit board of a control board part that controls the thyristor. Mounted on the surface of the printed circuit board are a capacitor, a transistor and the like constituting a control circuit element. An attachment plate is fixed to the control board part at a predetermined position in order to relay or fix an external power supply, a signal line and the like electrically connected to the control circuit element and the like.

The attachment plate is fixed by screwing a screw, inserted from the rear surface of the printed circuit board through a substrate through hole extending through a land of the printed circuit board, into a screw hole opened in the attachment plate. When applying power to the control circuit element and the like to operate them, the attachment plate needs to be electrically connected to the ground (ground potential) of the printed circuit board so as to block electric noise from the outside. For this reason, the attachment plate is electrically connected to the ground of the printed circuit board by implementing the screw by a metal screw. It is noted that Japanese Patent Laying-Open Nos. 2002-203931 and 2004-281743 disclose this kind of technical field.

SUMMARY OF THE INVENTION

Vibration resistance is required of the semiconductor device described above depending on an object on which the semiconductor device is to be mounted. In particular, a semiconductor device including a power semiconductor element, such as a thyristor, the demand for vibration resistance is great. For this reason, in the semiconductor device, the attachment plate for relaying and the like an external power supply, a signal line and the like is required to be reliably fixed to the control board part. The present invention was made as part of such a development, and has an object to provide a semiconductor device in which an attachment plate can be attached to a control board part more firmly.

A semiconductor device according to the present invention is a semiconductor device having a control board part with a semiconductor element mounted thereon. The control board part includes a substrate body and an attachment plate. The substrate body has a first main surface and a second main surface opposed to each other. The semiconductor element is mounted on the first main surface. The attachment plate is fixed to the first main surface of the substrate body with a predetermined screw. A member used for establishing electric connection with the control board part is attached to the attachment plate. An elastic washer having elastic force sandwiched between a first planar member and a second planar member, each having formed therein a through hole through which the predetermined screw is inserted, is interposed between the first main surface of the substrate body and the attachment plate, and the predetermined screw is inserted from the second main surface of the substrate body through a substrate through hole extending through the substrate body, the first planar member, the elastic washer, and the second planar member and is screwed into a screw hole formed in the attachment plate, thereby fixing the attachment plate to the substrate body.

In the semiconductor device according to the present invention, the attachment plate can be attached to the control board part more firmly.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

A semiconductor device according to a first embodiment of the present invention will be described. In each embodiment, a gate commutated turn-off (GCT) thyristor will be illustrated as an example of a semiconductor element.

Figure 1:
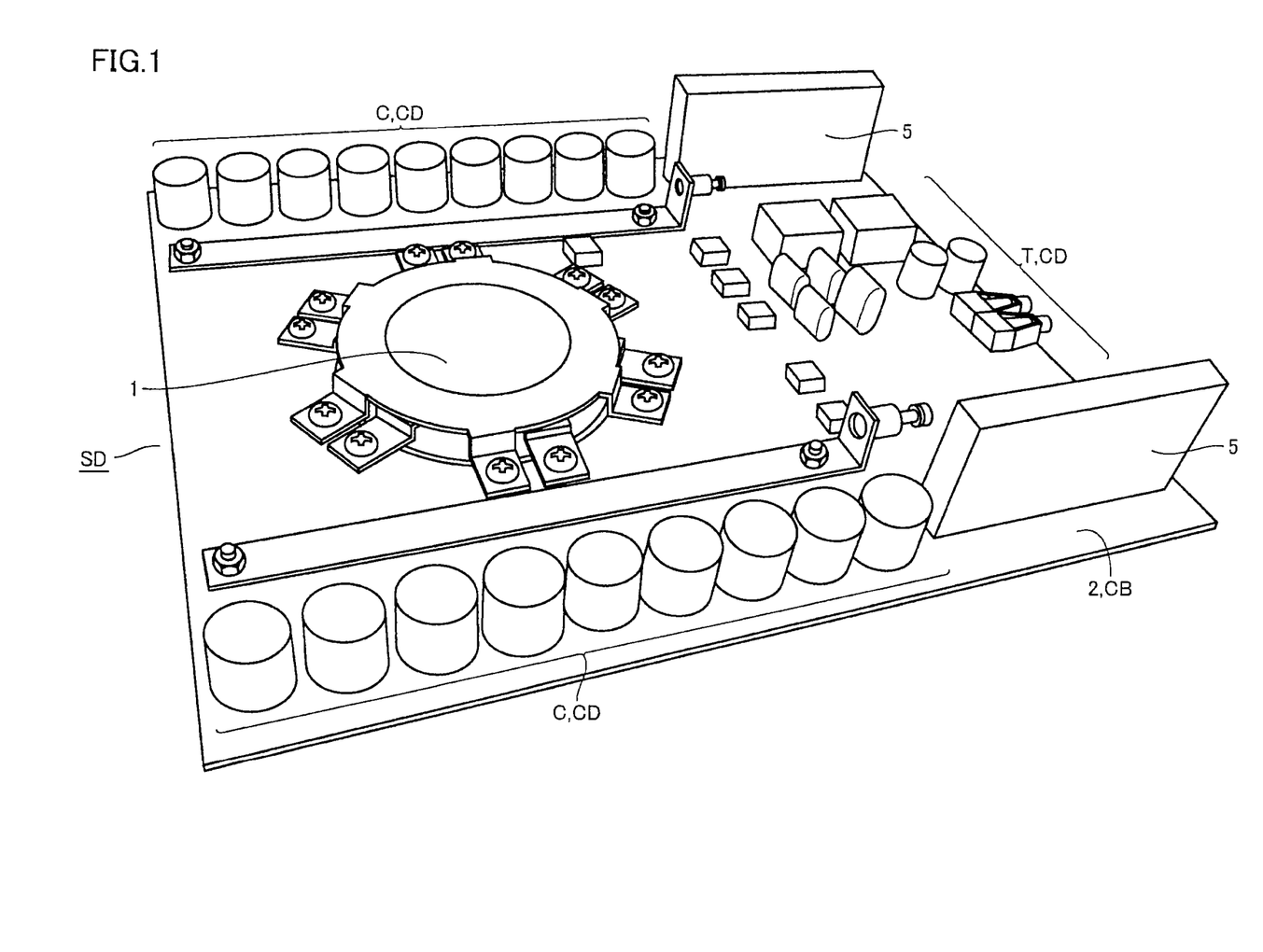
FIG. 1 is a perspective view showing the appearance of a semiconductor device according to a first embodiment of the present invention.

An overview of the semiconductor device will be described first. As shown in FIG. 1, in a semiconductor device SD, a gate commutated turn-off thyristor 1 is attached to a predetermined circuit pattern on a printed circuit board 2 (substrate body) of a control board part CB. Capacitors C constituting a control circuit element CD are mounted in proximity to thyristor 1. Capacitors C are mounted along the respective ends of printed circuit board 2 opposed to each other such that thyristor 1 is interposed therebetween. In addition to capacitors C, transistors T and the like are mounted as a control circuit element CD in proximity to thyristor 1.

Further, attachment plates 5 are attached to printed circuit board 2 so as to relay and/or fix an external power supply, a signal line and the like electrically connected to such a control circuit element CD and the like. Attachment plates 5 are made of metal, such as aluminum, for example, and are attached such that a region where transistors T and the like are mounted is interposed therebetween. It is noted that attachment plate 5 can also be used as a handle when carrying control board part CB, and a cooling fin can be attached to attachment plate 5.

Figure 2:
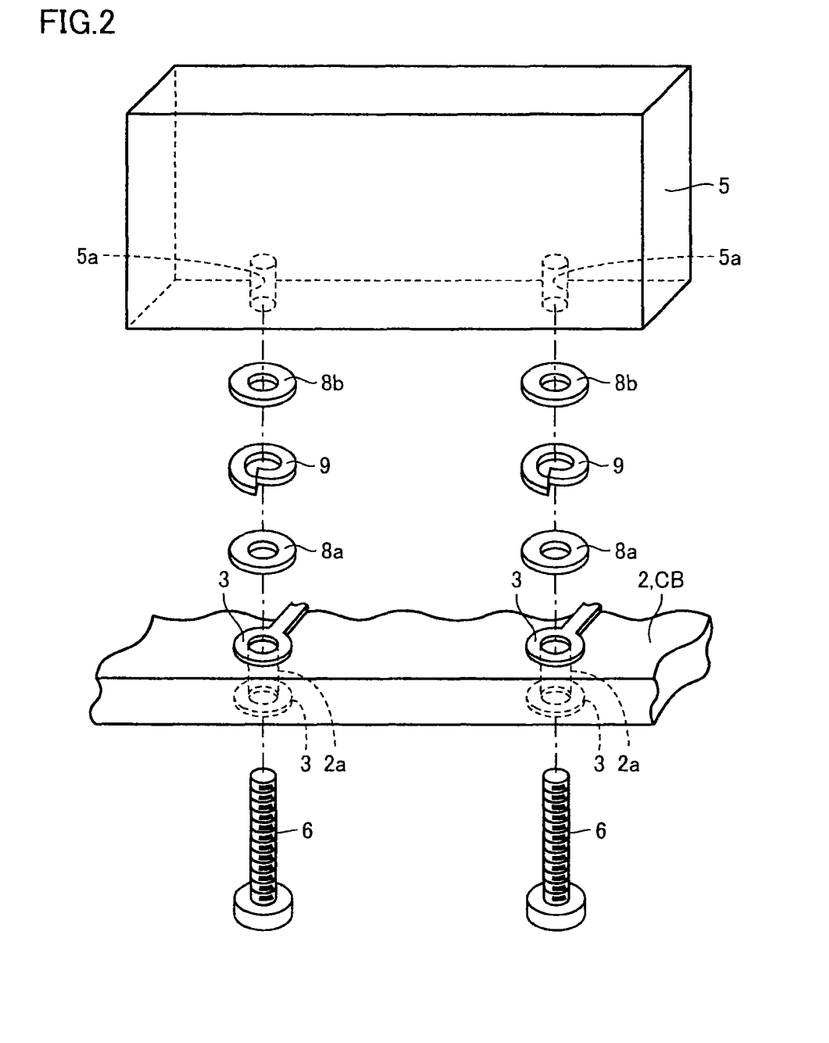
FIG. 2 is a partial exploded perspective view showing a structure for attaching an attachment plate to a control board part in the embodiment.
Figure 3:
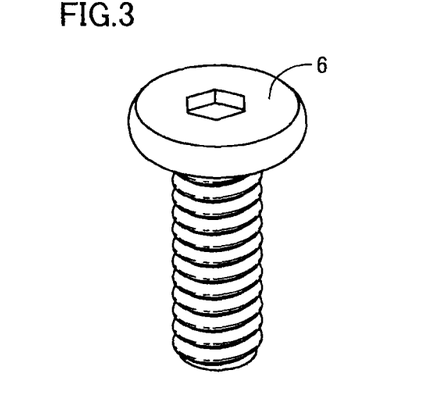
FIG. 3 is a perspective view showing a screw used to attach the attachment plate to the control board part in the embodiment.

A structure for attaching attachment plate 5 to printed circuit board 2 will now be described. As shown in FIG. 2, a spring washer 9 sandwiched between flat washers 8a and 8b is interposed between a land 3 on one surface of printed circuit board 2 of control board part CB and attachment plate 5, and a screw 6 is inserted from the other surface of printed circuit board 2 through a substrate through hole 2a extending through printed circuit board 2 (land 3), flat washer 8a, spring washer 9, and flat washer 8b and is screwed into a screw hole 5a formed in attachment plate 5, thereby fixing attachment plate 5 to printed circuit board 2 (see FIG. 4). It is noted that flat washers 8a and 8b are identical flat washers. Screw 6 is a metal screw, and as shown in FIG. 3, a hexagonal hole into which a hexagonal wrench is fitted is formed in the head of screw 6.

Figure 4:
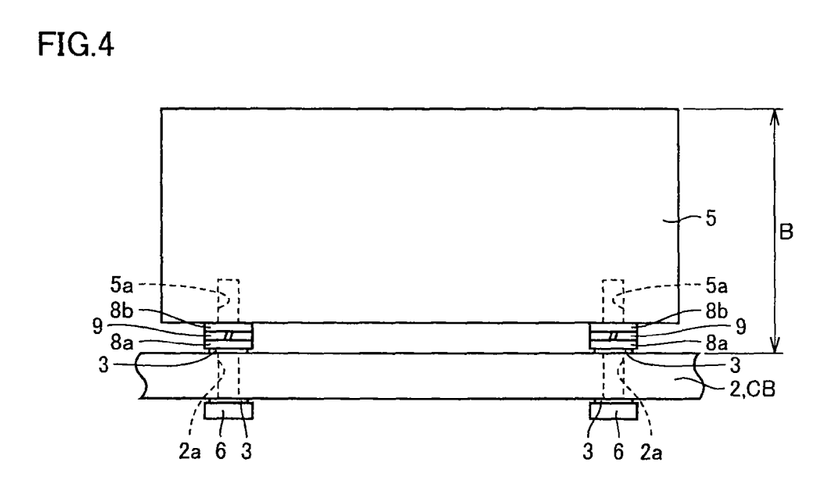
FIG. 4 is a partial side view showing a structure for attaching the attachment plate to the control board part in the embodiment.

As shown in FIG. 4, in the state where attachment plate 5 is fixed to printed circuit board 2 with metal screws 6, attachment plate 5 is electrically connected to land 3 of printed circuit board 2, and is fixed at a ground potential. By fixing attachment plate 5 at the ground potential, electric noise from the outside can be blocked when applying power to the control circuit element and the like to operate them, so that the semiconductor device can be operated stably.

In the structure for attaching attachment plate 5 to printed circuit board 2 in the semiconductor device described above, the use of spring washer 9 made of metal can effectively prevent attachment plate 5 from rattling or the like due to vibration or the like. This will be described with reference to a semiconductor device of a comparative example.

Figure 5:
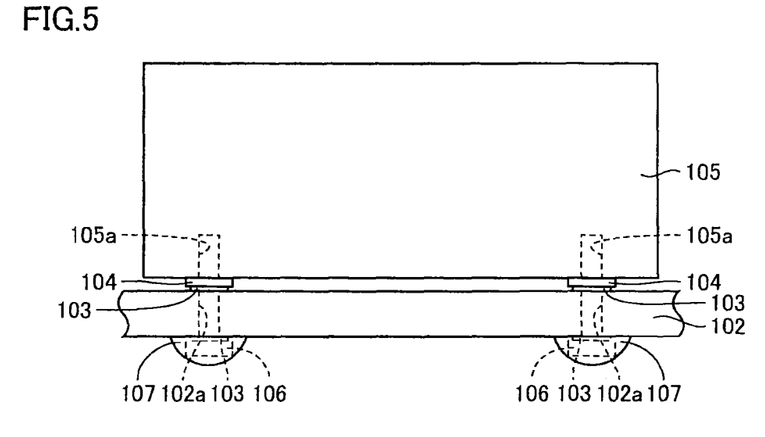
FIG. 5 is a partial side view showing a structure for attaching an attachment plate to a control board part in a semiconductor device according to a comparative example.

As shown in FIG. 5, in the semiconductor device of the comparative example, a washer 104 made of resin is interposed between a land 103 of one surface of a printed circuit board 102 and attachment plate 5, and a screw 106 is inserted from the other surface of printed circuit board 102 through a substrate through hole 102a extending through printed circuit board 102 (land 103) and washer 104 and is screwed into a screw hole 105a formed in attachment plate 105, thereby fixing attachment plate 105 to printed circuit board 102. The head of screw 106 and land 103 of printed circuit board 102 are soldered 107.

In the semiconductor device of the comparative example, washer 104 is implemented by washer 104 made of plastics, such as Teflon (registered trademark). Therefore, when soldering 107 the head of screw 106, attachment plate 105 may rattle from reasons such as deformation of washer 104 by that heat and/or reduction in thickness of washer 104 due to secular changes. When vibration is transmitted to the control board part including such printed circuit board 102, attachment plate 105 may be separated from printed circuit board 102.

In order to prevent such rattling of attachment plate 105, a countermeasure of increasing torque at the time of screwing screw 106 is conceivable. However, it has been revealed by experiments that increasing torque causes washer 104 made of plastic to be compressed by attachment plate 105 and printed circuit board 102, so that washer 104 is reduced in thickness.

In contrast, in the semiconductor device described above, the use of spring washer 9 made of metal can effectively prevent rattling of attachment plate 5 due to elastic force of spring washer 9, even if a control board part CB5 may vibrate. This can prevent attachment plate 5 from being separated from printed circuit board 2 to cause a power supply, a signal line and the like to swag to damage the control circuit element and the like mounted on the printed circuit board and/or to cut or short interconnections of the printed circuit board.

Moreover, interposing metal flat washers 8a and 8b so as to sandwich spring washer 9 therebetween can prevent spring washer 9 from damaging or deforming land 3 of printed circuit board 2 or attachment plate 5. When land 3 of printed circuit board 2 is damaged or deformed, an electric contact of parts in contact with land 3 may not be established well. When attachment plate 5 is damaged or deformed, a dimension B of attachment plate 5 from printed circuit board 2 (see FIG. 4) may not reach a defined value, and for example, blocking of electric noise by attachment plate 5 may be affected. In the semiconductor device described above, such deficiencies can be prevented by interposing metal flat washers 8a and 8b.

Further, by not interposing flat washer 8a, spring washer 9 and flat washer 8b at the side of the head of screw 6, the height of the head of the screw protruding from one surface of printed circuit board 2 can be minimized similarly to the case of the semiconductor device of the comparative example. It is held preferable to limit the height of the head of screw 6 protruding from one surface of printed circuit board 2 to as low as possible, preferably to 5 mm or less. This results from consideration for improving electric insulation between the control board part and an external housing (not shown) to ensure safety since the semiconductor device controls an extremely high voltage where the withstand voltage is 6500V.

Second Embodiment

Figure 6:
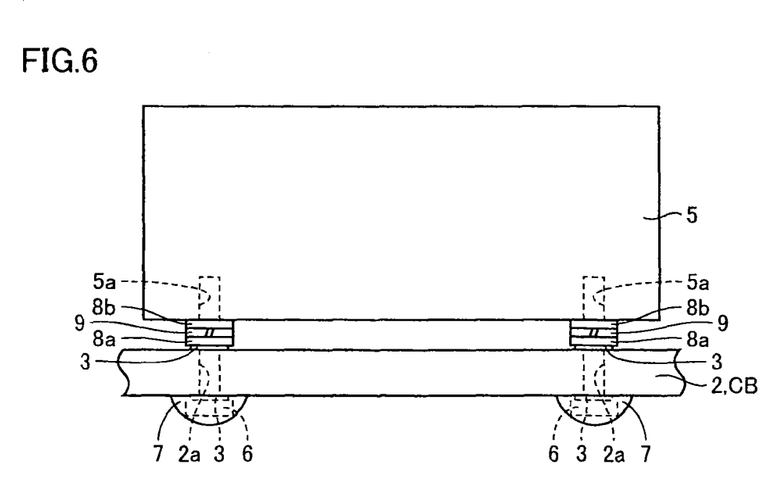
FIG. 6 is a partial side view showing a structure for attaching an attachment plate to a control board part in a semiconductor device according to a second embodiment of the present invention.

A semiconductor device according to a second embodiment of the present invention will be described. As shown in FIG. 6, in a structure for attaching attachment plate 5 to printed circuit board 2 in the present semiconductor device, the head of screw 6 and land 3 are joined with solder 7 for each of a plurality of screws 6 that fix attachment plate 5 to printed circuit board 2. It is noted that, since the structure except this is similar to the structures shown in FIGS. 2 and 4, like members are denoted by like reference numerals, description of which will thus not be repeated.

In addition to the previously described effects of preventing attachment plate 5 from rattling due to spring washer 9 and preventing attachment plate 5 and the like from being damaged by the flat washers, the following effects are achieved in the semiconductor device described above. That is, for each of the plurality of screws 6, screw 6 can be reliably prevented from loosening because the head of screw 6 and land 3 are joined with solder 7. This can prevent rattling of attachment plate 5 and the like more effectively. Further, by fixing the head of screw 6 to land 3 with solder 7, the contact resistance between screw 6 and land 3 can be reduced, so that attachment plate 5 can be reliably fixed at the ground potential.

Third Embodiment

As a semiconductor device according to a third embodiment of the present invention, a variation of the semiconductor device described above (Second Embodiment) will be described.

Figure 7:
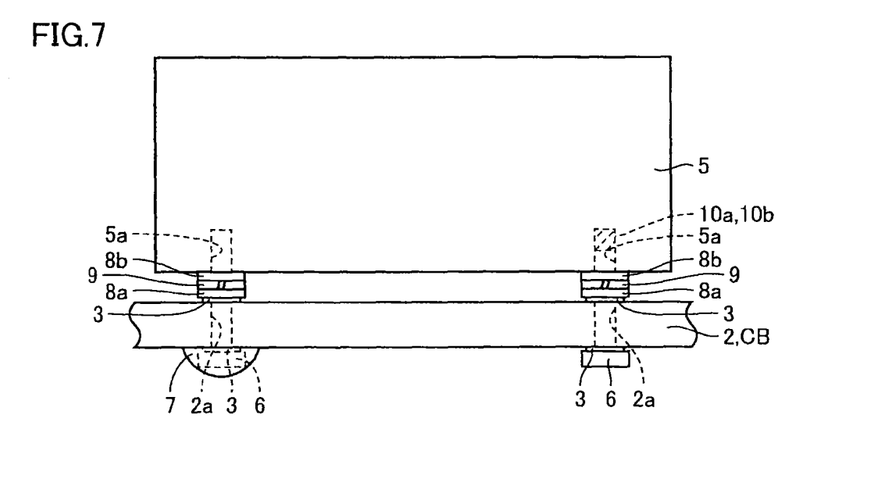
FIG. 7 is a partial side view showing a structure for attaching an attachment plate to a control board part in a semiconductor device according to a third embodiment of the present invention.

In the present semiconductor device, as shown in FIG. 7, the head of screw 6 and land 3 are joined with solder 7 for one screw 6 among the plurality of screws 6 that fix attachment plate 5 to printed circuit board 2. For the remaining screws 6, screws 6 having been subjected to a MEC process 10*a* at the tip are used, thereby fixing attachment plate 5 to printed circuit board 2. Alternatively, attachment plate 5 may be fixed to printed circuit board 2 by bonding screw 6 and screw hole 5*a* with an adhesive 10*b*. It is noted that, since the structure except this is similar to the structures shown in FIGS. 2 and 4, like members are denoted by like reference numerals, description of which will thus not be repeated.

In addition to the previously described effects of preventing attachment plate 5 from rattling due to spring washer 9 and preventing attachment plate 5 and the like from being damaged by the flat washers, the following effects are achieved in the semiconductor device described above. That is, for one of the plurality of screws 6, the head of that screw 6 and land 3 are joined with solder 7, which simplifies the soldering operation, so that the operating efficiency can be improved. Moreover, soldering 7 can reduce the contact resistance between screw 6 and land 3, so that attachment plate 5 can be reliably fixed at the ground potential.

Further, for the screws to which solder 7 has not been applied, screws 6 having been subjected to MEC process 10*a* at the tip are used, or screw 6 and screw hole 5*a* are bonded with adhesive 10*b*, so that attachment plate 5 can be fixed to printed circuit board 2 more firmly. This can prevent rattling of attachment plate 5 and the like more reliably.

It is noted that, when fixing attachment plate 5 to printed circuit board 2 with screws having been subjected to MEC process 10*a* or adhesive 10*b*, the case in which attachment plate 5 and screws 6 cannot be electrically connected well is conceivable because MEC process 10*a* produces an electric insulator or adhesive 10*b* is an electric insulator. Therefore, land 3 having formed therein substrate through hole 2*a* through which such a screw 6 is inserted does not need to be electrically connected to the ground of printed circuit board 2.

Fourth Embodiment

A semiconductor device according to a fourth embodiment of the present invention will be described. Here, a first example of a semiconductor device to which a conductive member is applied instead of one of the two flat washers that sandwich the spring washer as described in the first embodiment will be described.

Figure 8:
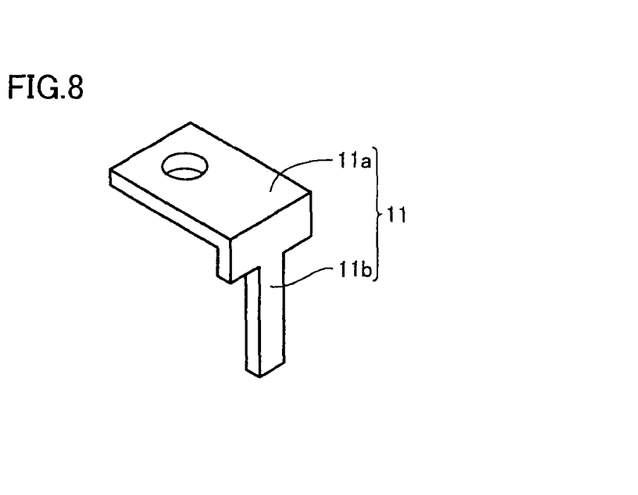
FIG. 8 is a perspective view showing a conductive member applied to a semiconductor device according to a fourth embodiment of the present invention.

As shown in FIG. 8, a conductive member 11 includes a planar section 11*a* having formed therein a screw insertion hole through which a screw is inserted and a ground potential connected section 11*b* to be electrically connected to the ground potential of the printed circuit board.

Figure 9:
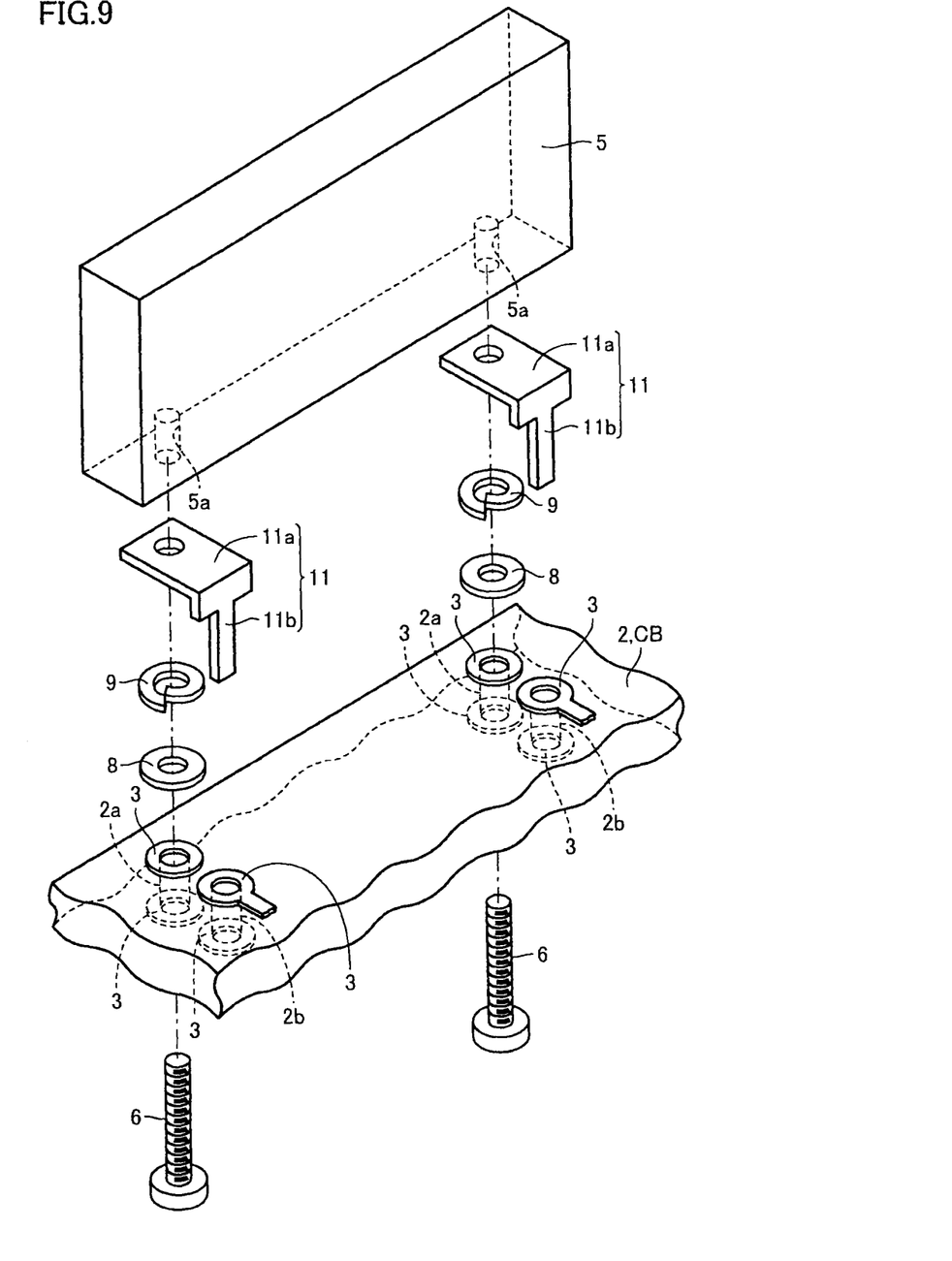
FIG. 9 is a partial exploded perspective view showing a structure for attaching an attachment plate to a control board part in the embodiment.
Figure 10:
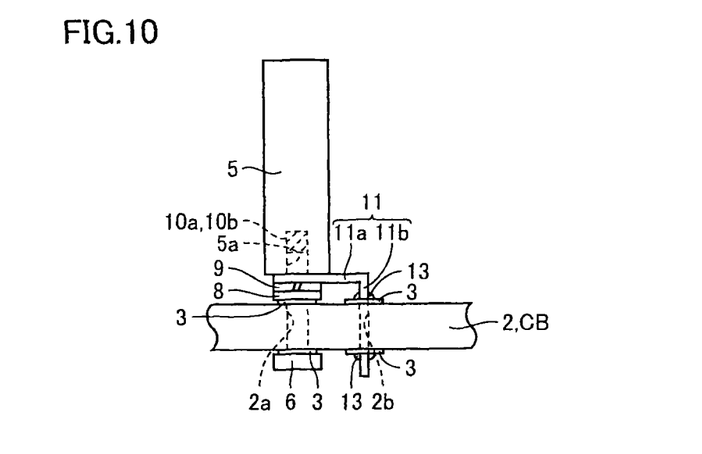
FIG. 10 is a partial side view showing the structure for attaching the attachment plate to the control board part in the embodiment.

The structure for attaching the attachment plate to the printed circuit board to which conductive member 11 is applied will now be described. As shown in FIGS. 9 and 10, spring washer 9 sandwiched between a flat washer 8 and planar section 11*a* of conductive member 11 is interposed between land 3 on one surface of printed circuit board 2 of control board part CB and attachment plate 5, and screw 6 is inserted from the other surface of printed circuit board 2 through substrate through hole 2*a*, flat washer 8, spring washer 9, and planar section 11*a* of conductive member 11 and is screwed into screw hole 5*a* formed in attachment plate 5, thereby fixing attachment plate 5 to printed circuit board 2.

At this time, ground potential connected section 11*b* of conductive member 11 is inserted through through hole 2*b* formed in printed circuit board 2 to be electrically connected to land 3 on the rear surface of printed circuit board 2 with solder 13 (through hole mounting). Attachment plate 5 is fixed to printed circuit board 2 by using a screw 6 having been subjected to MEC process 10*a* at the tip or by bonding screw 6 and screw hole 5*a* with adhesive 10*b*. It is noted that, since the structure except this is similar to the structure shown in FIG. 2, 7 or the like, like members are denoted by like reference numerals, description of which will thus not be repeated.

In addition to the previously described effect of preventing attachment plate 5 from rattling due to spring washer 9 by using screw 6 having been subjected to MEC process 10*a* at the tip in addition to spring washer 9 or by bonding screw 6 and screw hole 5*a* with adhesive 10*b*, the following effects are achieved in the semiconductor device described above.

That is, while increase in electric resistance between screw 6 and attachment plate 5 due to MEC process 10*a* or adhesive 10 is of concern, ground potential connected section 11*b* of conductive member 11 (planar section 11*a*) interposed between attachment plate 5 and spring washer 9 instead of one flat washer 8*b* (see FIG. 2) is electrically connected to land 3 formed on the rear surface of printed circuit board 2. Thereby, attachment plate 5 is reliably fixed at the ground potential, and when applying power to the control circuit element and the like to operate them, electric noise from the outside can be blocked to allow the semiconductor device to operate stably.

Moreover, by interposing planar section 11*a* of conductive member 11 between spring washer 9 and attachment plate 5, attachment plate 5 can be prevented from being damaged by spring washer 9 when screwing screw 6, similarly to the case of interposing flat washer 8*b* (First Embodiment, etc).

It is noted that, land 3 formed on the surface of printed circuit board 2 with which flat washer 8 is in contact does not need to be electrically connected to the ground because attachment plate 5 is fixed at the ground potential with conductive member 11.

Fifth Embodiment

A semiconductor device according to a fifth embodiment of the present invention will be described. Here, a second example of a semiconductor device to which a conductive member is applied instead of one of the two flat washers that sandwich the spring washer as described in the first embodiment will be described.

Figure 11:
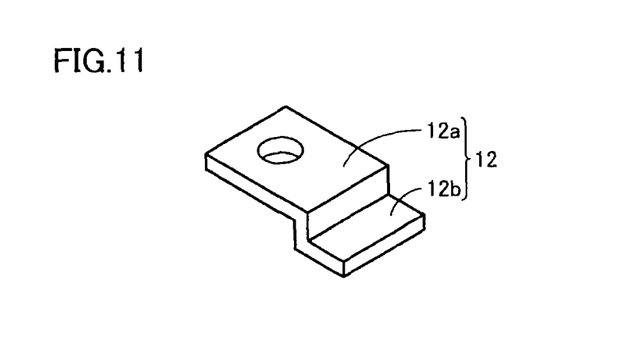
FIG. 11 is a perspective view showing a conductive member applied to a semiconductor device according to a fifth embodiment of the present invention.

As shown in FIG. 11, a conductive member 12 includes a planar section 12a having formed therein a screw insertion hole through which a screw is inserted and a ground potential connected section 12b to be electrically connected at the ground potential of the printed circuit board.

Figure 12:
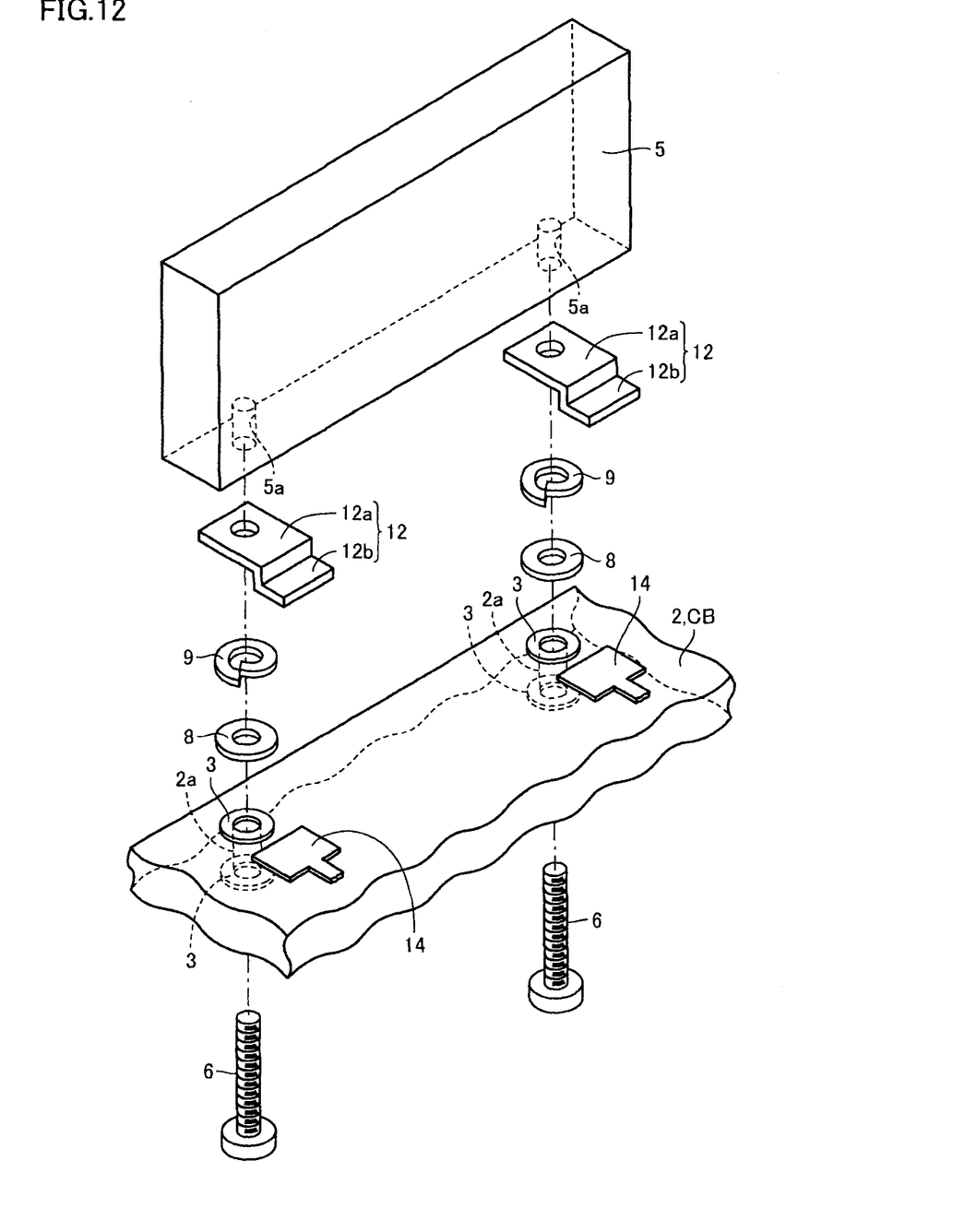
FIG. 12 is a partial exploded perspective view showing a structure for attaching an attachment plate to a control board part in the embodiment.
Figure 13:
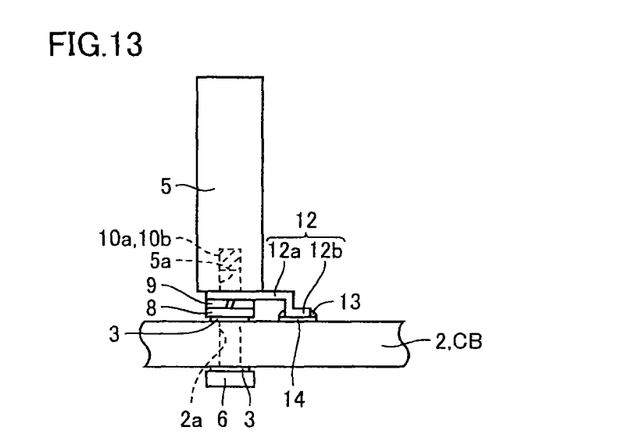
FIG. 13 is a partial side view showing the structure for attaching the attachment plate to the control board part in the embodiment.

The structure for attaching the attachment plate to the printed circuit board to which conductive member 12 is applied will now be described. As shown in FIGS. 12 and 13, spring washer 9 sandwiched between flat washer 8 and planar section 12a of conductive member 12 is interposed between land 3 on one surface of printed circuit board 2 of control board part CB and attachment plate 5, and screw 6 is inserted from the other surface of printed circuit board 2 through substrate through hole 2a, flat washer 8, spring washer 9, and planar section 12a of conductive member 12 and is screwed into screw hole 5a formed in attachment plate 5, thereby fixing attachment plate 5 to printed circuit board 2.

At this time, ground potential connected section 12b of conductive member 12 is electrically connected to a pad 14 on the surface of printed circuit board 2 with solder 13 (surface mounting). Pad 14 is electrically connected to the ground. Attachment plate 5 is fixed to printed circuit board 2 with screw 6 having been subjected to MEC process 10a at the tip or by bonding screw 6 and screw hole 5a with adhesive 10b. It is noted that, since the structure except this is similar to the structure shown in FIG. 2, 7 or the like, like members are denoted by like reference numerals, description of which will thus not be repeated.

In addition to the previously described effect of preventing attachment plate 5 from rattling more reliably by using screw 6 having been subjected to MEC process 10a at the tip in addition to spring washer 9 or by bonding screw 6 and screw hole 5a with adhesive 10b, the following effects are achieved in the semiconductor device described above.

That is, ground potential connected section 12b of conductive member 12 (planar section 12a) interposed between attachment plate 5 and spring washer 9 instead of one flat washer 8b (see FIG. 2) is electrically connected to pad 14 formed on the surface of printed circuit board 2. Thereby, attachment plate 5 is reliably fixed at the ground potential, and when applying power to the control circuit element and the like to operate them, electric noise from the outside can be blocked to allow the semiconductor device to operate stably.

Moreover, by interposing planar section 12a of conductive member 12 between spring washer 9 and attachment plate 5, attachment plate 5 can be prevented from being damaged by spring washer 9 when screwing screw 6, similarly to the case of interposing flat washer 8b (First Embodiment, etc).

It is noted that land 3 formed on the surface of printed circuit board 2 with which flat washer 8 is in contact does not need to be electrically connected to the ground because attachment plate 5 is fixed at the ground potential with conductive member 12.

Sixth Embodiment

A semiconductor device according to a sixth embodiment of the present invention will be described. Here, a variation of the semiconductor device described in the fourth embodiment to which a conductive member is applied will be described.

Figure 14:
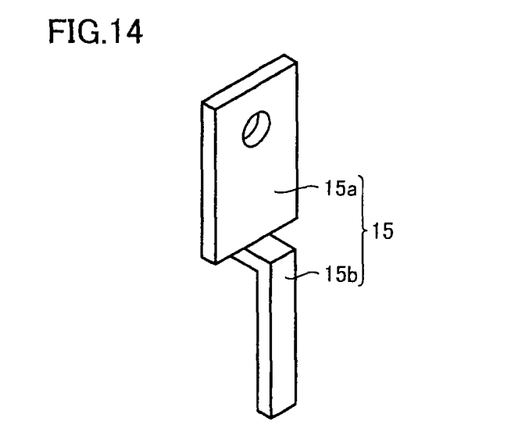
FIG. 14 is a perspective view showing a conductive member applied to a semiconductor device according to a sixth embodiment of the present invention.

As shown in FIG. 14, a conductive member 15 includes a planar section 15a having formed therein a screw insertion hole through which a screw is inserted and a ground potential connected section 15b to be electrically connected to the ground potential of the printed circuit board.

Figure 15:
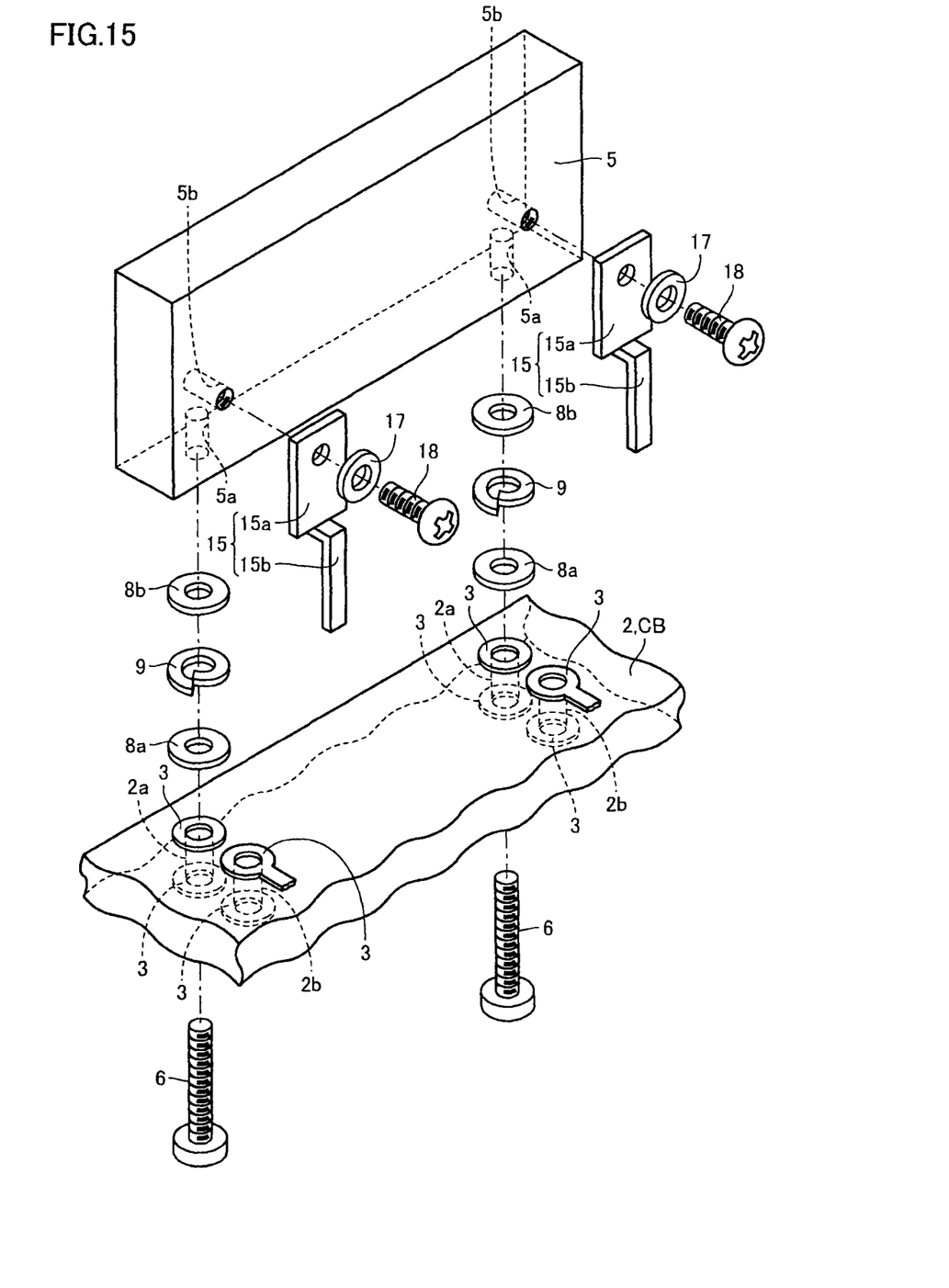
FIG. 15 is a partial exploded perspective view showing a structure for attaching an attachment plate to a control board part in the embodiment.
Figure 16:
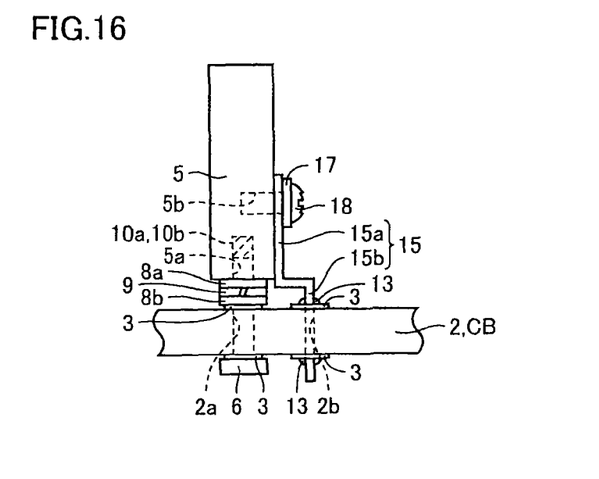
FIG. 16 is a partial side view showing the structure for attaching the attachment plate to the control board part in the embodiment.

The structure for attaching the attachment plate to the printed circuit board to which conductive member 15 is applied will now be described. As shown in FIGS. 15 and 16, spring washer 9 sandwiched between flat washers 8a and 8b is interposed between land 3 on one surface of printed circuit board 2 of control board part CB and attachment plate 5, and screw 6 is inserted from the other surface of printed circuit board 2 through substrate through hole 2a, flat washer 8a, spring washer 9, and flat washer 8b and is screwed into screw hole 5a formed in attachment plate 5, thereby fixing attachment plate 5 to printed circuit board 2.

Moreover, attachment plate 5 is fixed to printed circuit board 2 with screw 6 having been subjected to MEC process 10a at the tip or by bonding screw 6 and screw hole 5a with adhesive 10b.

A flat washer 17 is interposed between planar section 15a and the head of a screw 18, and screw 18 is inserted through flat washer 17 and planar section 15a and is screwed into a screw hole 5b formed in the side surface of attachment plate 5, thereby fixing planar section 15a of conductive member 15 to a side surface of attachment plate 5. Ground potential connected section 15b of conductive member 15 is inserted through through hole 2b formed in printed circuit board 2 to be electrically connected to land 3 formed on the front or rear surface of printed circuit board 2 with solder 13 (through hole mounting). It is noted that, since the structure except this is similar to the structure shown in FIG. 2, 7 or the like, like members are denoted by like reference numerals, description of which will thus not be repeated.

In addition to the previously described effect of preventing attachment plate 5 from rattling more reliably by using screw 6 having been subjected to MEC process 10a at the tip in addition to spring washer 9 or by bonding screw 6 and screw hole 5a with adhesive 10b, the following effects are achieved in the semiconductor device described above.

That is, planar section 15a of conductive member 15 is fixed to the side surface of attachment plate 5, while ground potential connected section 15b of conductive member 15 is electrically connected to land 3 formed on the front or rear surface of printed circuit board 2. Thereby, attachment plate 5 is reliably fixed at the ground potential, and when applying power to the control circuit element and the like to operate them, electric noise from the outside can be blocked to allow the semiconductor device to operate stably.

It is noted that land 3 formed on the surface of printed circuit board 2 with which flat washer 8a is in contact does not need to be electrically connected to the ground because attachment plate 5 is fixed at the ground potential with conductive member 15.

Seventh Embodiment

A semiconductor device according to a seventh embodiment of the present invention will be described. Here, a variation of the semiconductor device described in the fifth embodiment to which a conductive member is applied will be described.

Figure 17:
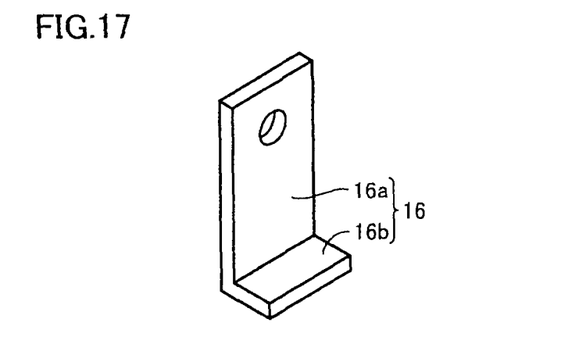
FIG. 17 is a perspective view showing a conductive member applied to a semiconductor device according to a seventh embodiment of the present invention.

As shown in FIG. 17, a conductive member 16 includes a planar section 16a having formed therein a screw insertion hole through which a screw is inserted and a ground potential connected section 16b to be electrically connected at the ground potential of the printed circuit board.

Figure 18:
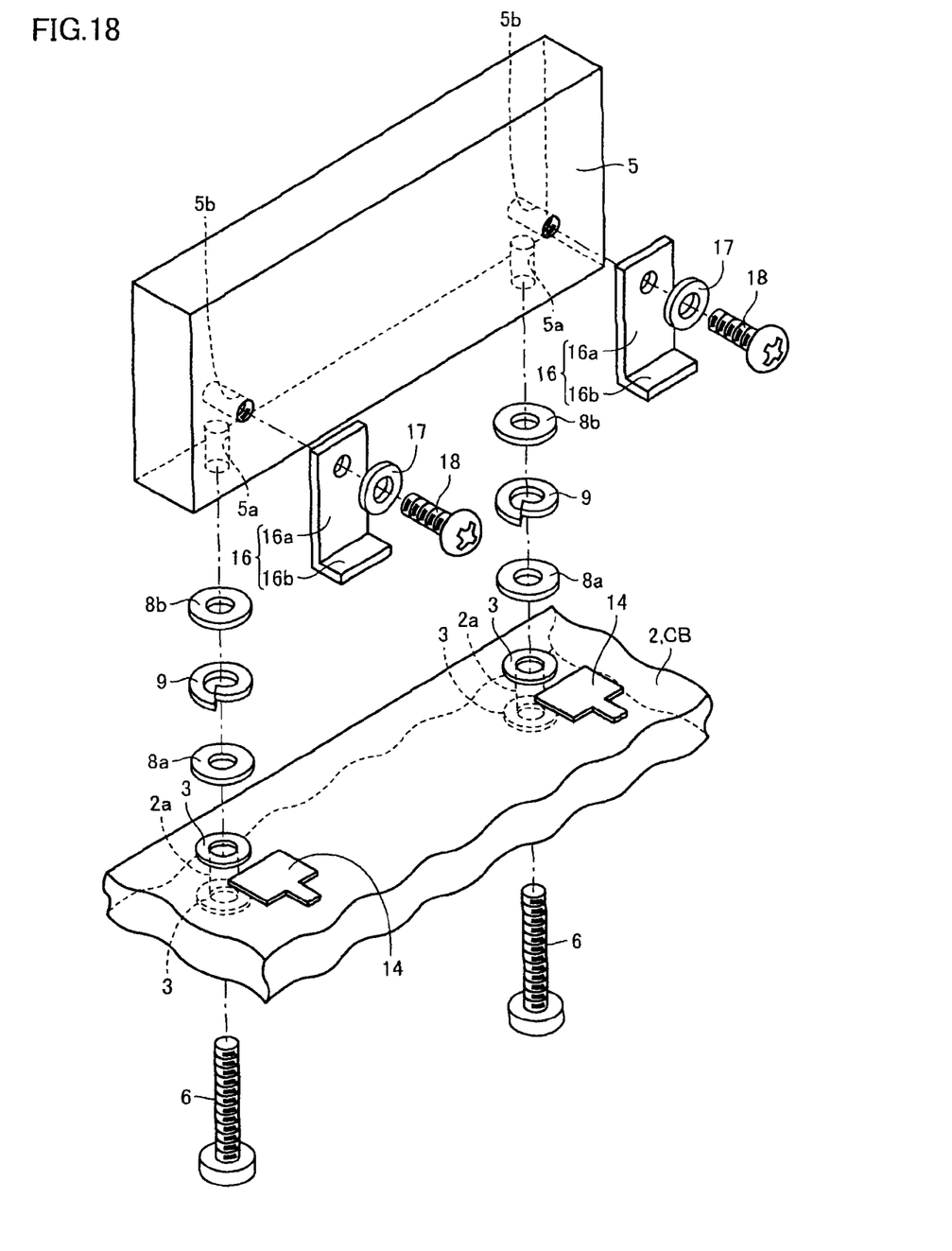
FIG. 18 is a partial exploded perspective view showing a structure for attaching an attachment plate to a control board part in the embodiment.
Figure 19:
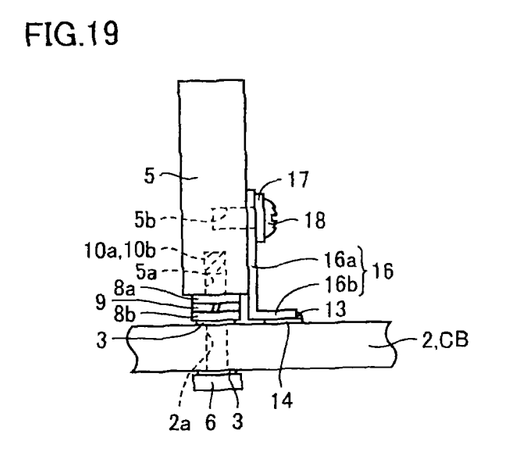
FIG. 19 is a partial side view showing the structure for attaching the attachment plate to the control board part in the embodiment.

The structure for attaching the attachment plate to the printed circuit board to which conductive member 16 is applied will now be described. As shown in FIGS. 18 and 19, spring washer 9 is sandwiched between flat washers 8a and 8b is interposed between land 3 on one surface of printed circuit board 2 of control board part CB and attachment plate 5, and screw 6 is inserted from the other surface of printed circuit board 2 through substrate through hole 2a, flat washer 8a, spring washer 9, and flat washer 8b and is screwed into screw hole 5a formed in attachment plate 5, thereby fixing attachment plate 5 to printed circuit board 2.

Moreover, attachment plate 5 is fixed to printed circuit board 2 by using screw 6 having been subjected to MEC process 10a at the tip or by bonding screw 6 and screw hole 5a with adhesive 10b.

Flat washer 17 is interposed between planar section 16a and the head of screw 18, and screw 18 is inserted through flat washer 17 and planar section 16a and is screwed into screw hole 5b formed in the side surface of attachment plate 5, thereby fixing planar section 16a of conductive member 16 to a side surface of attachment plate 5. Ground potential connected section 16b of conductive member 16 is electrically connected to pad 14 formed on the surface of printed circuit board 2 with solder 13 (surface mounting). It is noted that, since the structure except this is similar to the structure shown in FIG. 2, 7 or the like, like members are denoted by like reference numerals, description of which will thus not be repeated.

In addition to the previously described effect of preventing attachment plate 5 from rattling more reliably by using screw 6 having been subjected to MEC process 10a at the tip in addition to spring washer 9 or by bonding screw 6 and screw hole 5a with adhesive 10b, the following effects are achieved in the semiconductor device described above.

That is, planar section 16a of conductive member 16 is fixed to the side surface of attachment plate 5, while ground potential connected section 16b of conductive member 16 is electrically connected to pad 14 formed on the surface of printed circuit board 2. Thereby, attachment plate 5 is reliably fixed at the ground potential, and when applying power to the control circuit element and the like to operate them, electric noise from the outside can be blocked to allow the semiconductor device to operate stably.

It is noted that land 3 formed on the surface of printed circuit board 2 with which flat washer 8a is in contact does not need to be electrically connected to the ground because attachment plate 5 is fixed at the ground potential with conductive member 16.

Although the spring washer has been illustrated in each of the semiconductor devices described above, the washer is not limited to the spring washer as long as it has elastic force. For example, a wave washer, a conical spring washer or the like may be adopted. Although the gate commutated turn-off thyristor has been illustrated as the semiconductor element, the semiconductor element is not limited to this thyristor, but various semiconductor elements including a general-purpose thyristor can also be adopted.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device having a control board part with a semiconductor element mounted thereon, wherein
   said control board part includes
      a substrate body having a first main surface and a second main surface opposed to each other, said semiconductor element being mounted on said first main surface, and
      an attachment plate fixed to said first main surface of said substrate body with a predetermined screw, a member used for establishing electric connection with said control board part being attached to said attachment plate, and
   an elastic washer having elastic force sandwiched between a first planar member and a second planar member, each having formed therein a through hole through which said predetermined screw is inserted, is interposed between said first main surface of said substrate body and said attachment plate, and said predetermined screw is inserted from said second main surface of said substrate body through a substrate through hole extending through said substrate body, said first planar member, said elastic washer, and said second planar member and is screwed into a screw hole formed in said attachment plate, thereby fixing said attachment plate to said substrate body; and
   a land electrically connected at a ground potential formed in said substrate body.

2. The semiconductor device according to claim 1, wherein the head of said predetermined screw and said land are joined with solder.

3. The semiconductor device according to claim 1, wherein said attachment plate is fixed with a plurality of said predetermined screws, and
   the head of one predetermined screw among the plurality of said predetermined screws and said land are joined with solder.

4. The semiconductor device according to claim 3, wherein said attachment plate is fixed to said substrate body by one of a technique of using a screw having been subjected to a MEC process as an other predetermined screw among the plurality of said predetermined screws and a technique of bonding said other predetermined screw to said screw hole of said attachment plate with an adhesive.

5. The semiconductor device according to claim 1, comprising a conductive member including a planar section fixed to said attachment plate and a ground potential connected section connected to said planar section and electrically connected to a ground of said substrate body, wherein
   said attachment plate is fixed to said substrate body by one of a technique of using a screw having been subjected to a MEC process as said predetermined screw and a technique of bonding said predetermined screw to said attachment plate with an adhesive.

6. The semiconductor device according to claim 5, wherein said planar section of said conductive member constitutes said first planar member in which said through hole is formed, and
   said planar section is interposed between said elastic washer and said attachment plate.

7. The semiconductor device according to claim 5, wherein said planar section of said conductive member is fixed to a portion of said attachment plate other than a bottom surface opposed to said substrate body.

8. The semiconductor device according to claim 6, wherein said ground potential connected section of said conductive member is inserted through a through hole formed in said substrate body and is electrically connected to the ground on said second main surface of said substrate body.

9. The semiconductor device according to claim 7, wherein said ground potential connected section of said conductive member is inserted through a through hole formed in said substrate body and is electrically connected to the ground on said second main surface of said substrate body.

10. The semiconductor device according to claim 6, wherein said ground potential connected section of said conductive member is electrically connected to the ground on said first main surface of said substrate body.

11. The semiconductor device according to claim 7, wherein said ground potential connected section of said conductive member is electrically connected to the ground on said first main surface of said substrate body.

* * * * *